(12) United States Patent
Durney et al.

(10) Patent No.: US 7,152,450 B2
(45) Date of Patent: Dec. 26, 2006

(54) METHOD FOR FORMING SHEET MATERIAL WITH BEND CONTROLLING DISPLACEMENTS

(75) Inventors: Max W. Durney, San Francisco, CA (US); Philip M. Arnold, Redwood City, CA (US)

(73) Assignee: Industrial Origami, LLC, San Francisco, CA (US)

( * ) Notice: Subject to any disclaimer, the term of this patent is extended or adjusted under 35 U.S.C. 154(b) by 44 days.

(21) Appl. No.: 10/795,077

(22) Filed: Mar. 3, 2004

(65) Prior Publication Data

US 2004/0206152 A1  Oct. 21, 2004

Related U.S. Application Data

(63) Continuation-in-part of application No. 10/672,766, filed on Sep. 26, 2003, which is a continuation-in-part of application No. 10/256,870, filed on Sep. 26, 2002, now Pat. No. 6,877,349, which is a continuation-in-part of application No. 09/640,267, filed on Aug. 17, 2000, now Pat. No. 6,481,259.

(51) Int. Cl.
*B21D 28/00* (2006.01)
(52) U.S. Cl. .................................. 72/324; 72/379.2
(58) Field of Classification Search ............... 72/324, 72/379.2; 428/136
See application file for complete search history.

(56) References Cited

U.S. PATENT DOCUMENTS

| | | | |
|---|---|---|---|
| 975,121 A | 11/1910 | Carter | |
| 1,295,769 A | 2/1919 | Kux | |
| 1,405,042 A | 1/1922 | Kraft | |
| 1,698,891 A | 1/1929 | Overbury | |
| 2,127,618 A | 8/1938 | Riemenschneider | |
| 2,560,786 A | 7/1951 | Wright et al. | |
| 3,258,380 A | 6/1966 | Fischer et al. | |
| 3,341,395 A | 9/1967 | Weber | |
| 3,353,639 A | 11/1967 | Andriussi | |
| 3,756,499 A | 9/1973 | Giebel et al. | |
| 3,788,934 A | 1/1974 | Coppa | |
| 3,854,859 A | 12/1974 | Sola | |
| 3,938,657 A | 2/1976 | David | |
| 3,963,170 A | 6/1976 | Wood | |

(Continued)

FOREIGN PATENT DOCUMENTS

DE  298 18 909 U1  2/1999

(Continued)

OTHER PUBLICATIONS

Publication "Office dA" by Contemporary World Architects, 2000, pp. 15, 20-35, Rockport Publishers, Inc., Gloucester, Massachusetts.

(Continued)

*Primary Examiner*—Daniel C. Crane
(74) *Attorney, Agent, or Firm*—Dorsey & Whitney LLP

(57) ABSTRACT

A method of preparing a sheet of material for bending along a bend line comprising the step of forming of at least one displacement in the thickness direction of the sheet of material with a portion of the periphery of the displacement closest to the bend line providing an edge and opposed face configured in position to produce edge-to-face engagement of the sheet on opposite sides of the periphery during bending. The forming step is preferably accomplished using one of a stamping process, a punching process, a roll-forming process and an embossing process. A sheet of material suitable for bending using the process also is disclosed, as are the use of coatings, shin guards and displacing the area of the sheet between bending inducing slits.

34 Claims, 15 Drawing Sheets

U.S. PATENT DOCUMENTS

| | | | |
|---|---|---|---|
| 4,215,194 A | 7/1980 | Sheperd | |
| 4,289,290 A | 9/1981 | Miller | |
| 4,559,259 A | 12/1985 | Cetrelli | |
| 4,628,661 A | 12/1986 | St. Louis | |
| 4,837,066 A | 6/1989 | Quinn et al. | |
| 5,148,900 A | 9/1992 | Mohan | |
| 5,157,852 A | 10/1992 | Patrou et al. | |
| 5,225,799 A | 7/1993 | West et al. | |
| 5,239,741 A | 8/1993 | Shamos | |
| 5,390,782 A | 2/1995 | Sinn | |
| 5,524,396 A | 6/1996 | Lalvani | |
| 5,568,680 A | 10/1996 | Parker | |
| 5,692,672 A | 12/1997 | Hunt | |
| 5,701,780 A | 12/1997 | Ver Meer | |
| 5,709,913 A | 1/1998 | Anderson et al. | |
| 5,789,050 A | 8/1998 | Kang | |
| 5,885,676 A | 3/1999 | Lobo et al. | |
| 6,132,349 A | 10/2000 | Yokoyama | |
| 6,210,037 B1 | 4/2001 | Brandon, Jr. | |
| 6,412,325 B1 | 7/2002 | Croswell | |
| 6,481,259 B1 | 11/2002 | Durney | |
| 6,599,601 B1 | 7/2003 | Fogle et al. | |
| 6,640,605 B1 | 11/2003 | Gitlin et al. | |
| 6,643,561 B1 | 11/2003 | Torvinen | |
| 6,658,316 B1 | 12/2003 | Mehta et al. | |
| 2001/0010167 A1 | 8/2001 | Leak | |
| 2002/0184936 A1 | 12/2002 | Gitlin et al. | |
| 2003/0037586 A1 | 2/2003 | Durney et al. | |
| 2004/0035175 A1* | 2/2004 | Karhumaki | 72/319 |

FOREIGN PATENT DOCUMENTS

| | | |
|---|---|---|
| GB | 2 129 339 A | 5/1984 |
| JP | 52-068848 | 6/1977 |
| JP | 53-070069 | 6/1978 |
| JP | 55-022468 | 2/1980 |
| JP | 55-055222 | 4/1980 |
| JP | 59-006116 | 1/1984 |
| JP | 02-065416 | 5/1990 |
| JP | 02-165817 | 6/1990 |
| JP | 02-192821 | 7/1990 |
| JP | 02-258116 | 10/1990 |
| JP | 04-033723 | 2/1992 |
| JP | 04-091822 | 3/1992 |
| JP | 05-261442 | 10/1993 |
| JP | 07-148528 | 6/1995 |
| JP | 08-224619 | 9/1996 |
| JP | 10-085837 | 4/1998 |
| JP | 11-123458 | 5/1999 |
| JP | 11-188426 | 7/1999 |
| WO | WO 97/24221 | 7/1997 |

OTHER PUBLICATIONS

Patent Abstracts of Japan, vol. 004, No. 053 (M-008), Apr. 19, 1980 (JP 55-022-468 A).

Patent Abstracts of Japan, vol. 015, No. 006 (M-1066), Jan. 8, 1991 (JP 02-258116 A).

*EasyBend ™- Complex Bending Made Easy*, ©2004 Mate Precision Tolling Inc., Anoka, Minnesota.

Derwent Abstract Accession No. 99-062297/06, Class P52, DE 29818909U (Fortmeier) Dec. 24, 1998.

Derwent Abstract Accession No. 1999-340844/29, P52, JP 11 123458 A (Meiji Nat Kogyo KK) May. 11, 1999.

Derwent Abstract Accession No. 98-265616/24, P52, JP 10 085837 A (Mitsubishi Electric Corp) Apr. 7, 1998.

Derwent Abstract Accession No. 97-345802/32, P52, JP 9 141333 A (Kokusai Denki KK) Jun. 3, 1997.

Derwent Abstract Accession No. 1995-280162/37, M21, JP 3474242 B2 (Amada Co LTD) Dec. 8, 2003.

Derwent Abstract Accession No. 80-C6243C/12, FR 2428372 A (Merlin & Gerin SA) Feb. 8, 1980.

Derwent Abstract Accession No. 83-G2401K/19, FR 2514103 A (Grun) Apr. 8, 1983.

* cited by examiner

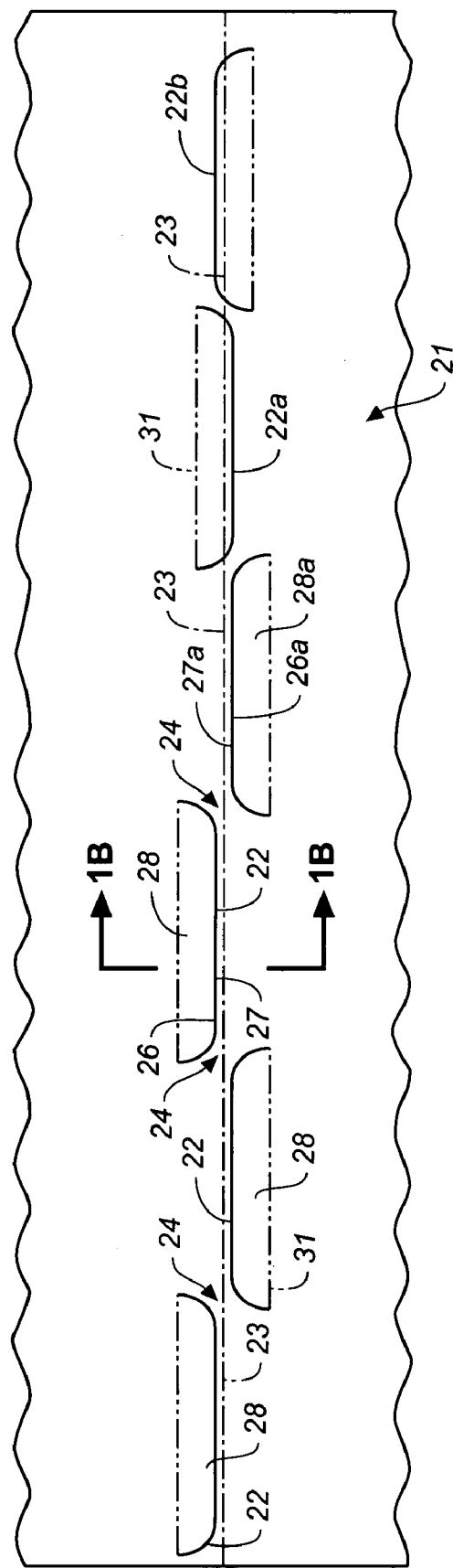

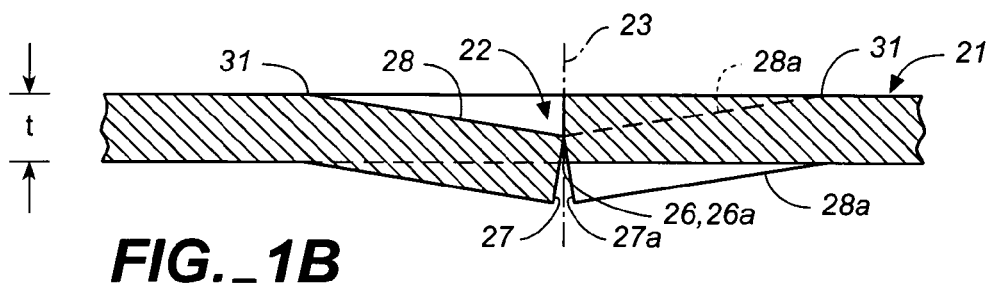
*FIG._1B*
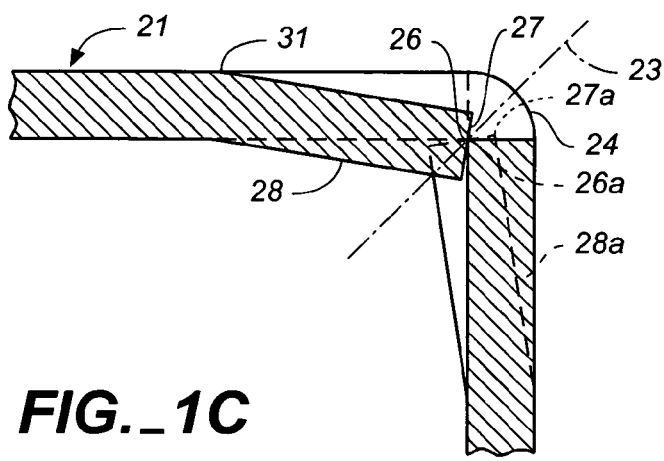
*FIG._1C*
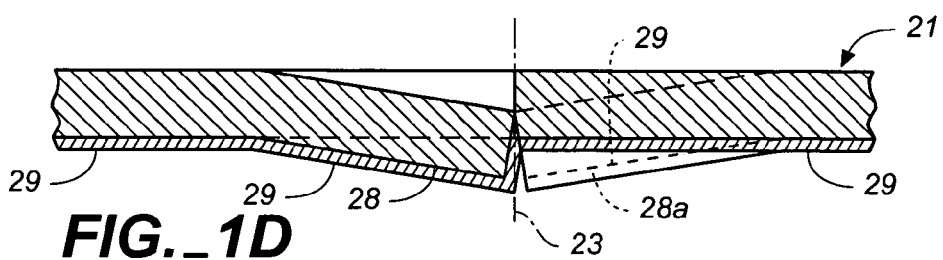
*FIG._1D*
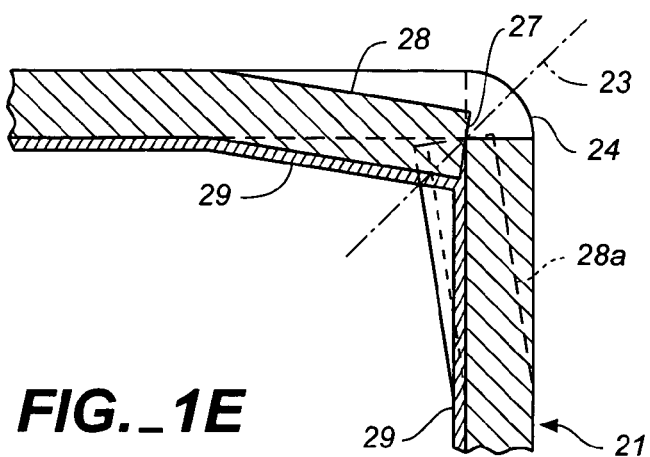
*FIG._1E*

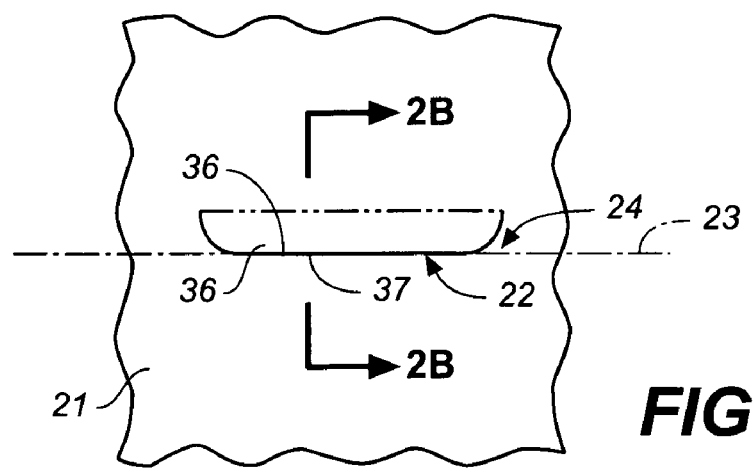
*FIG._2A*
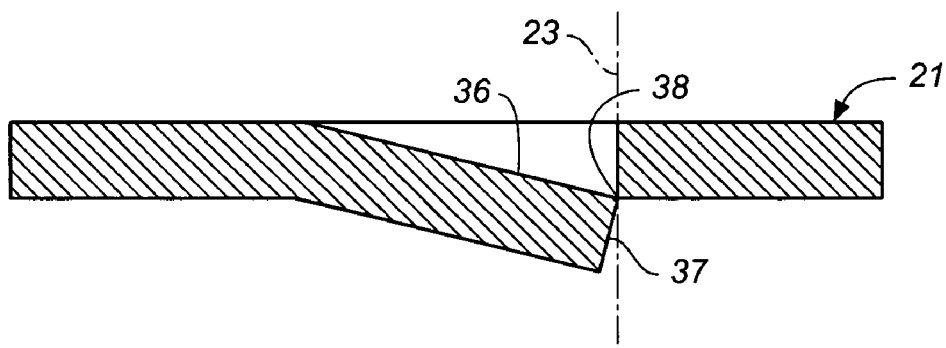
*FIG._2B*
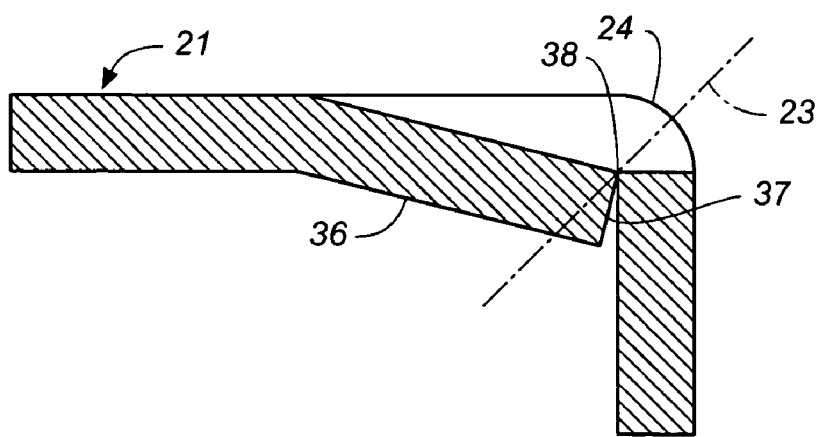
*FIG._2C*

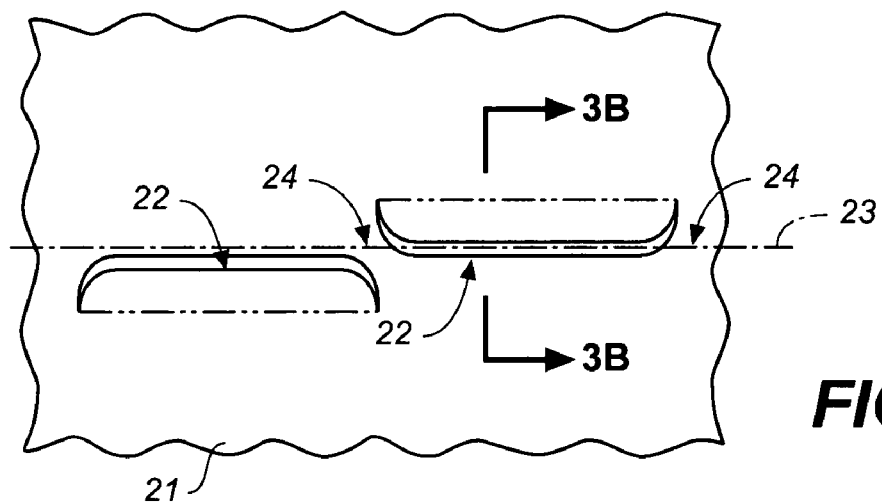
FIG._3A
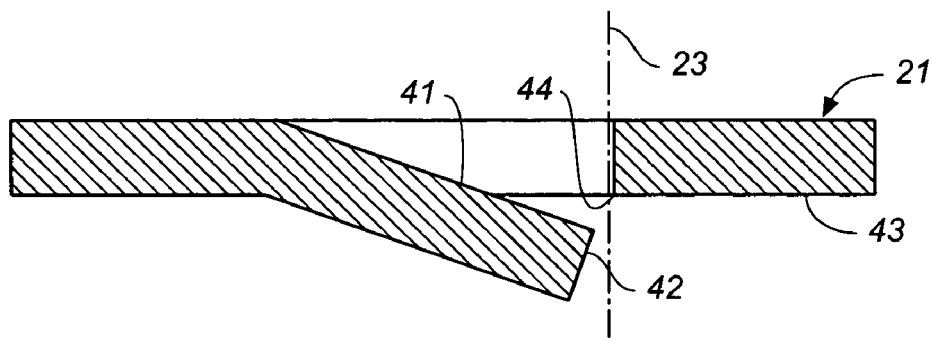
FIG._3B
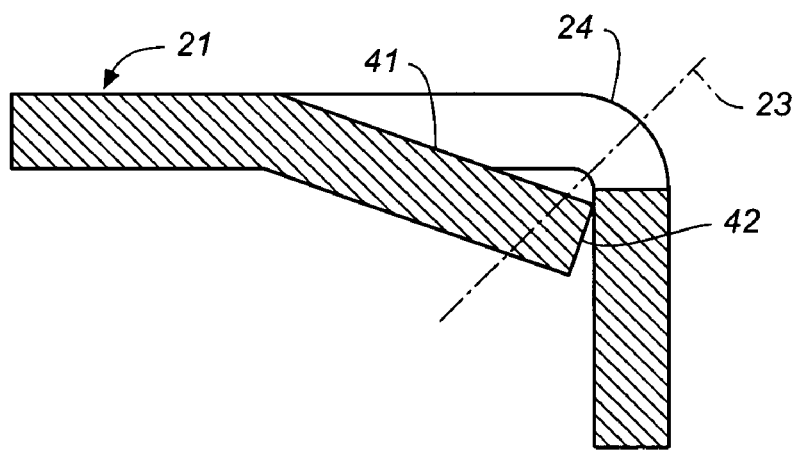
FIG._3C

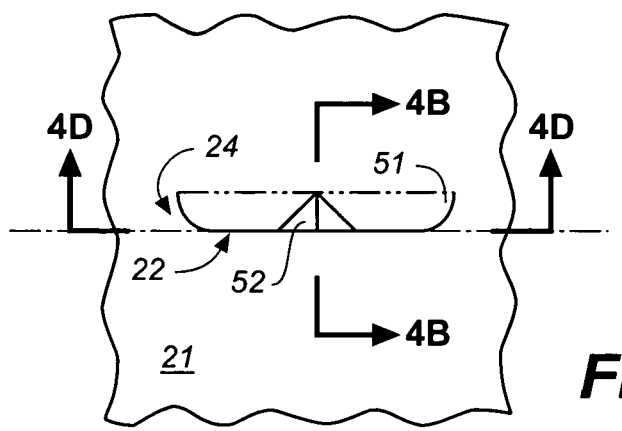
FIG._4A
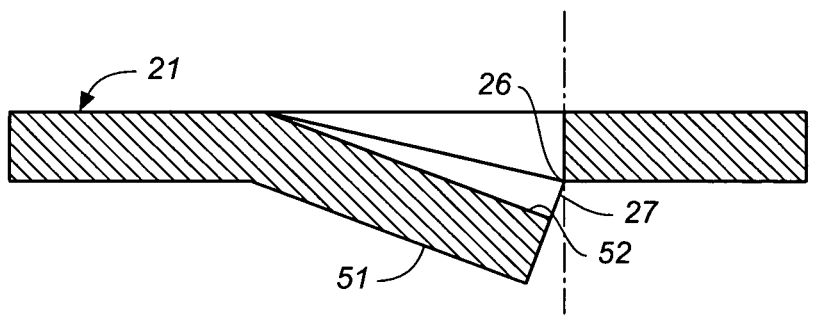
FIG._4B
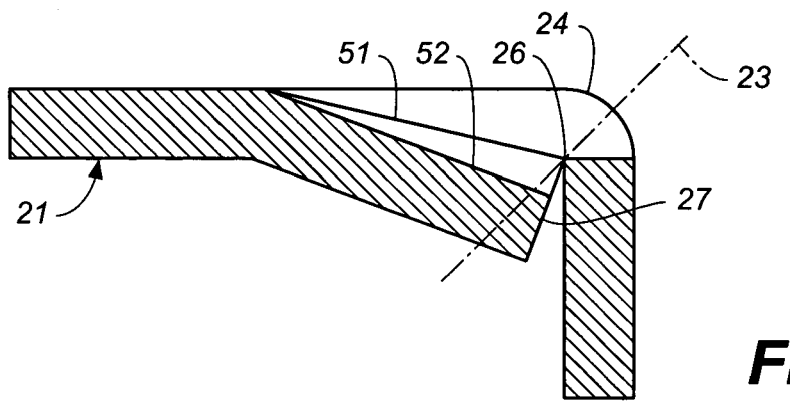
FIG._4C
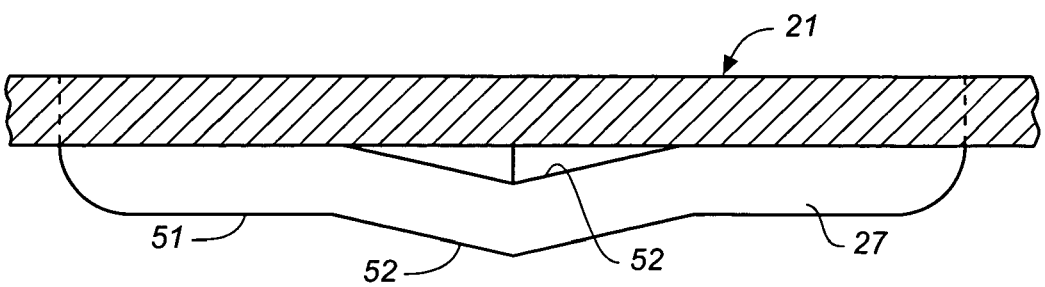
FIG._4D

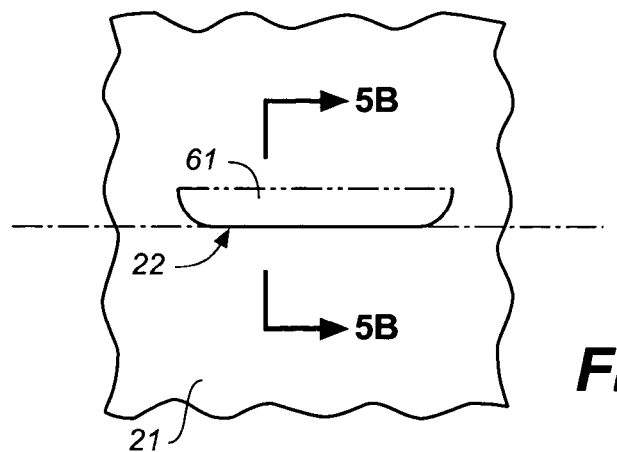
*FIG._5A*
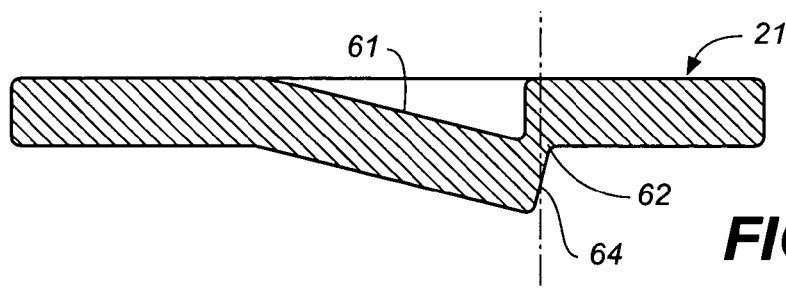
*FIG._5B*
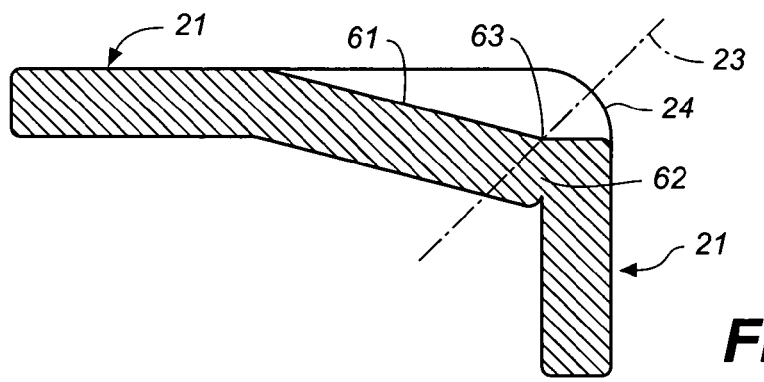
*FIG._5C*
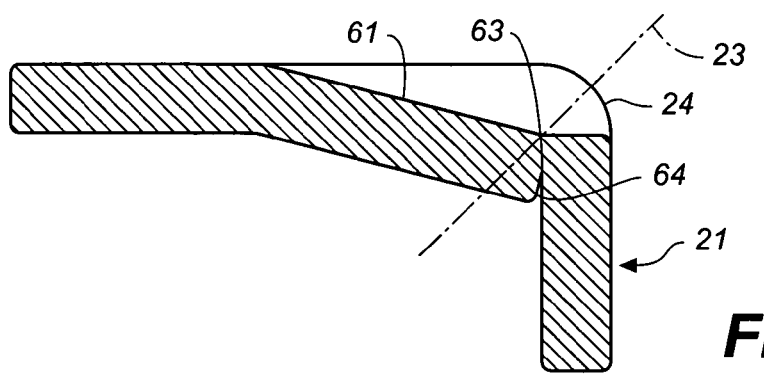
*FIG._5D*

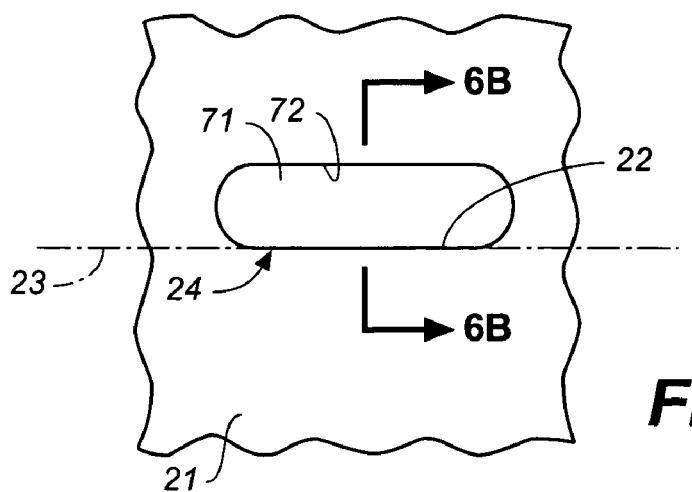
*FIG._6A*
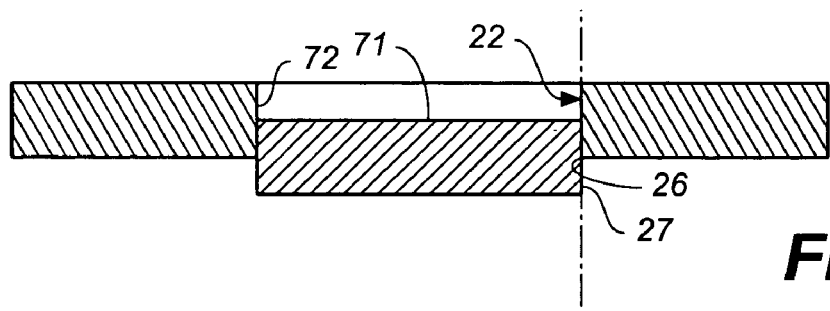
*FIG._6B*
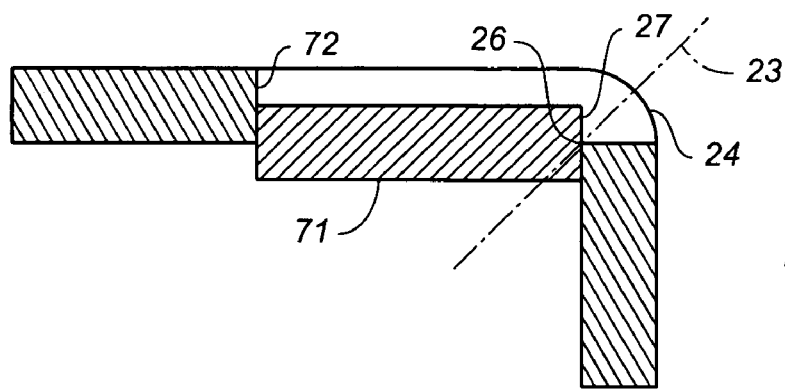
*FIG._6C*

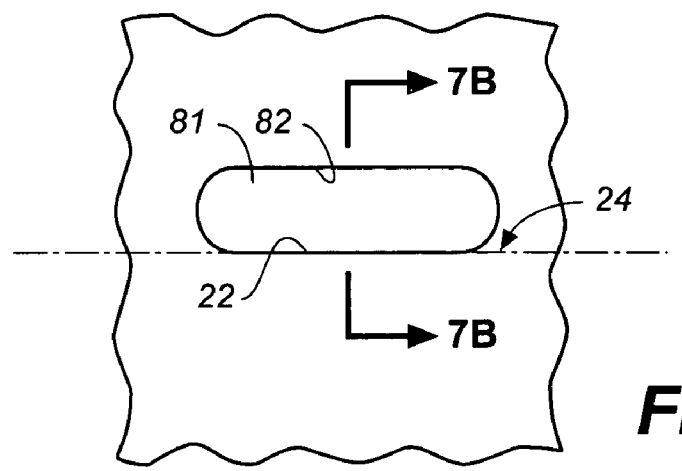
FIG._7A
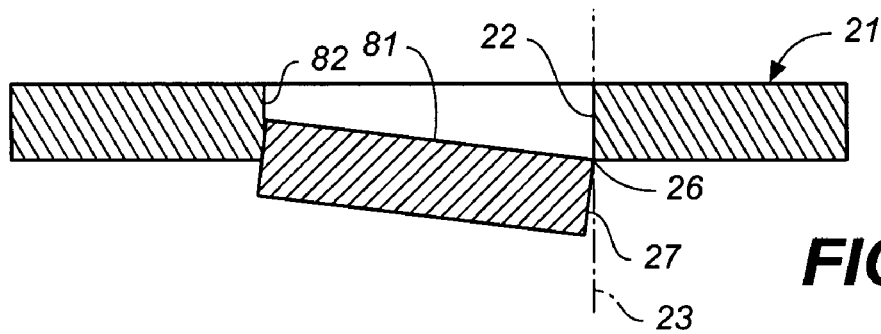
FIG._7B
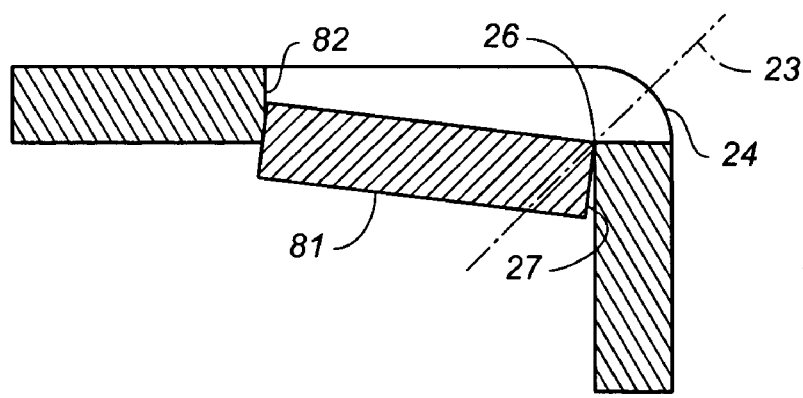
FIG._7C

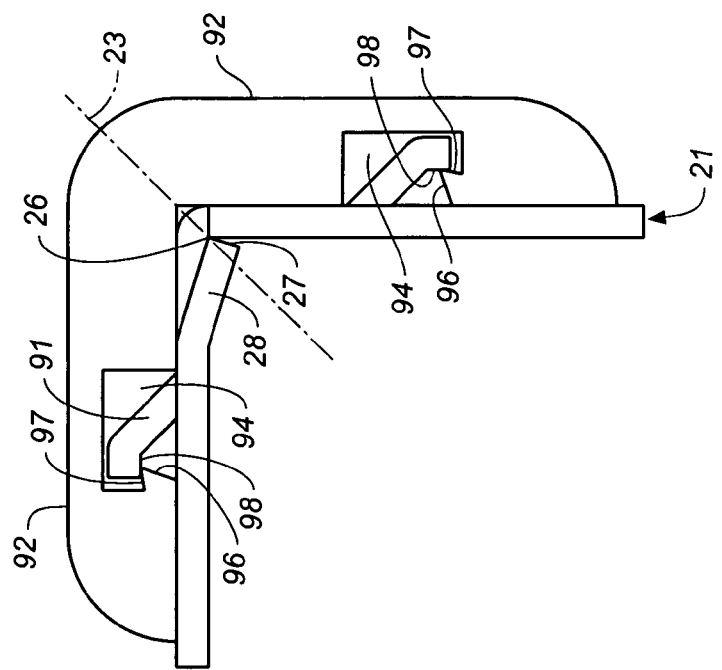
FIG._9
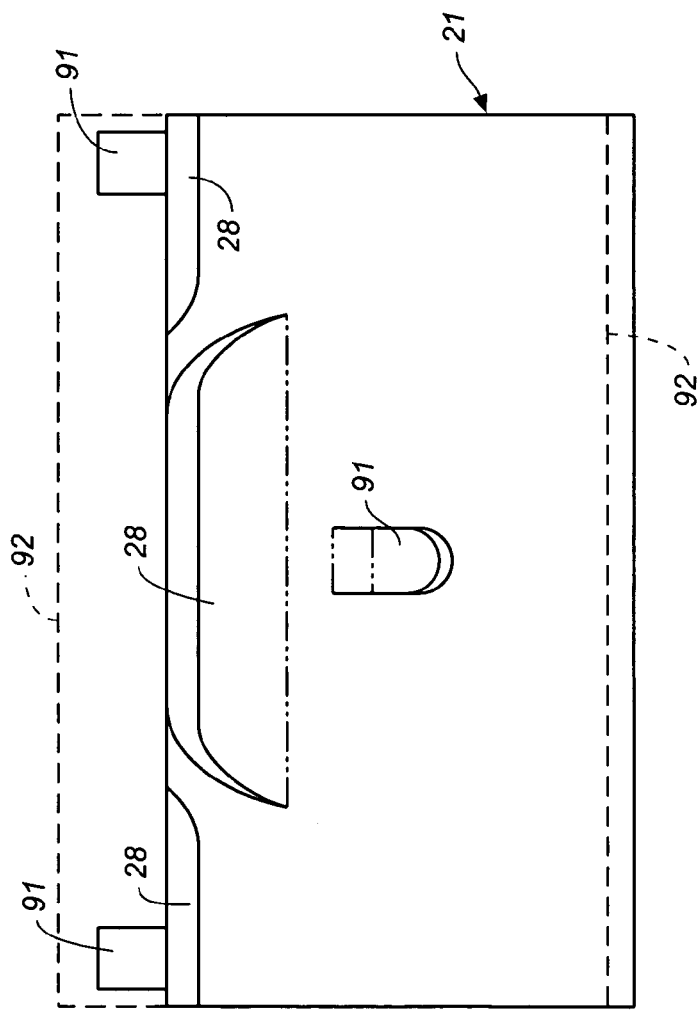
FIG._8

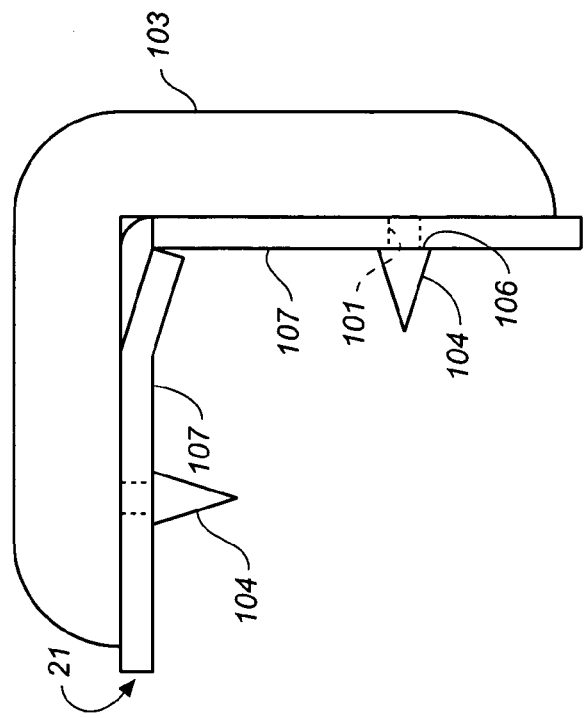
FIG._11
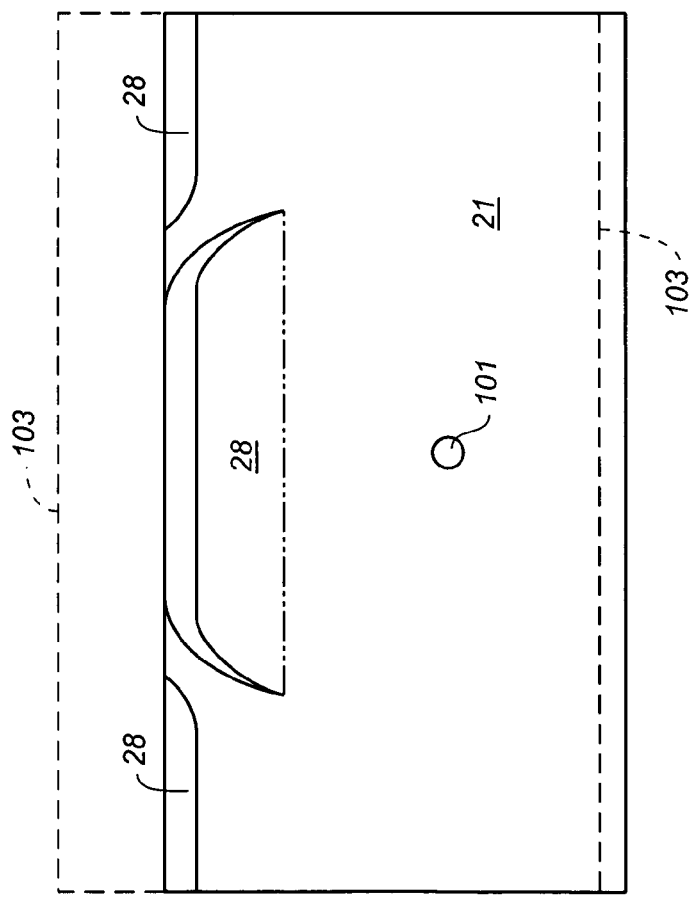
FIG._10

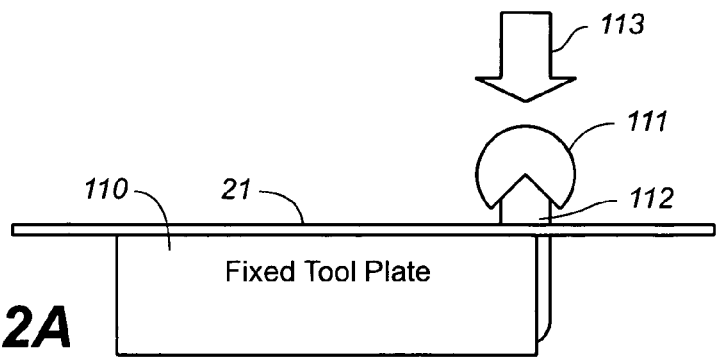
FIG._12A
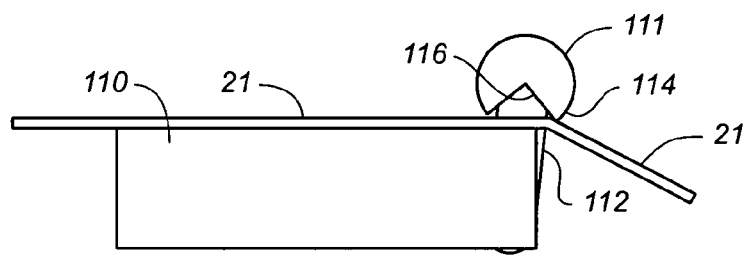
FIG._12B
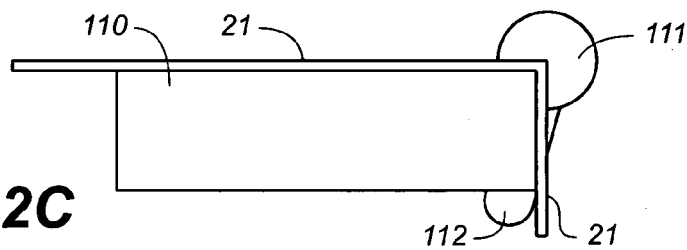
FIG._12C
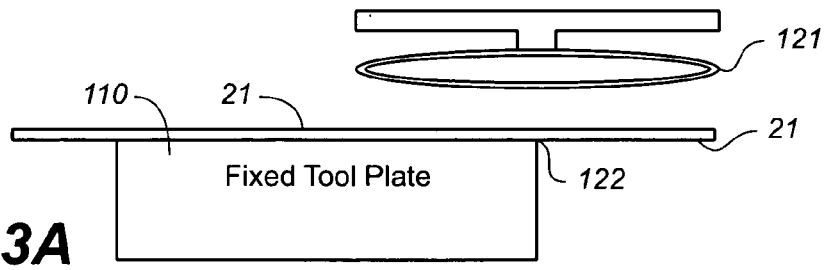
FIG._13A
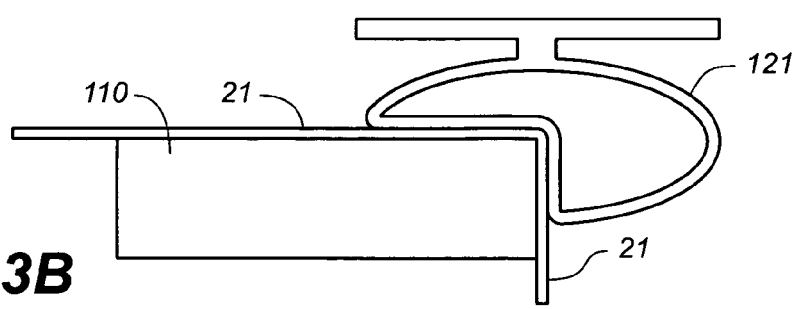
FIG._13B

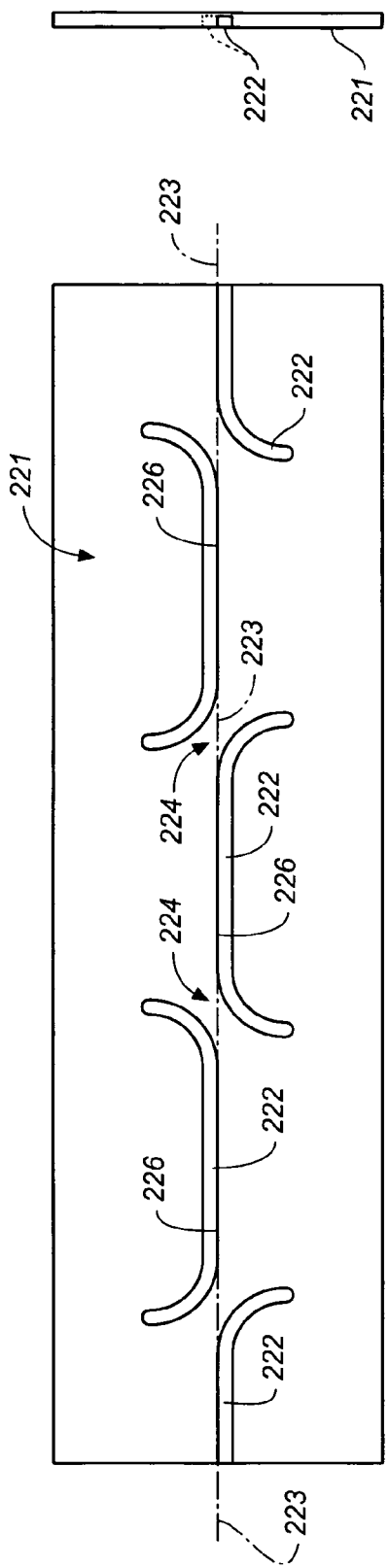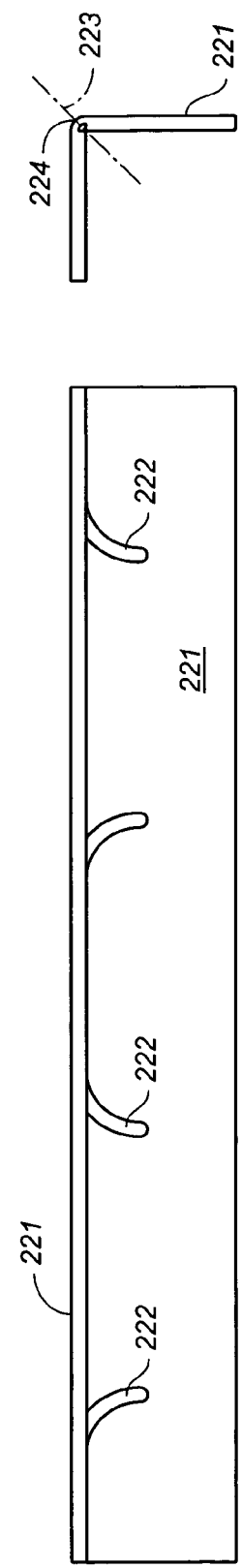

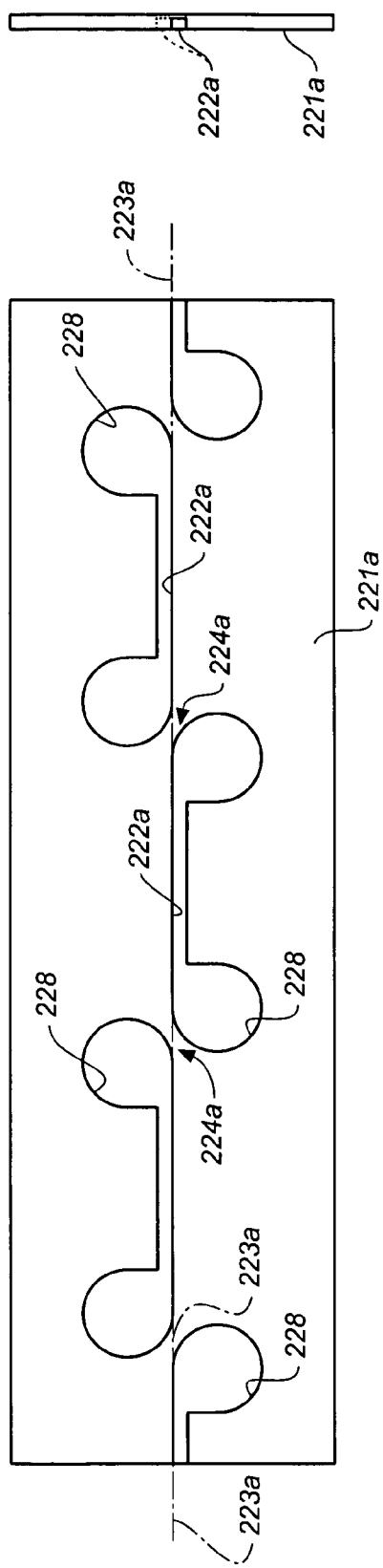
FIG._15A
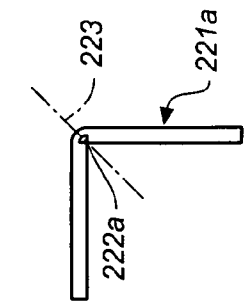
FIG._15B
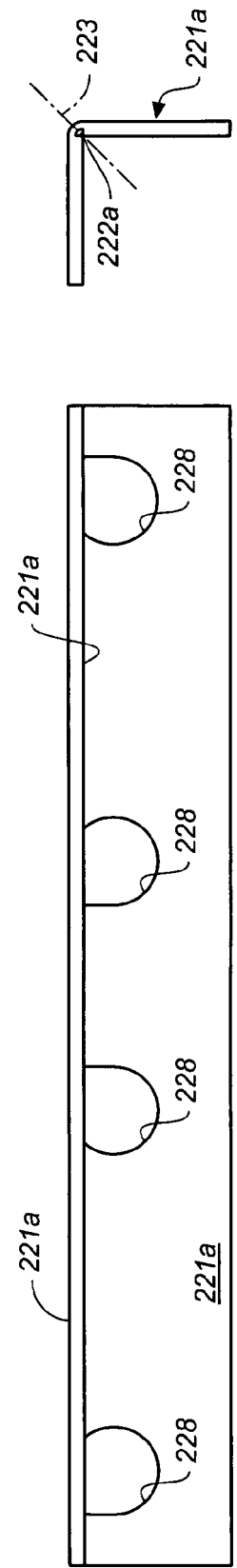
FIG._15C
FIG._15D

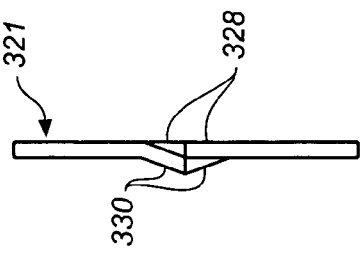
FIG._16B
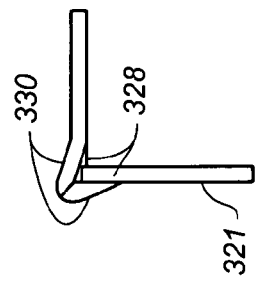
FIG._16D
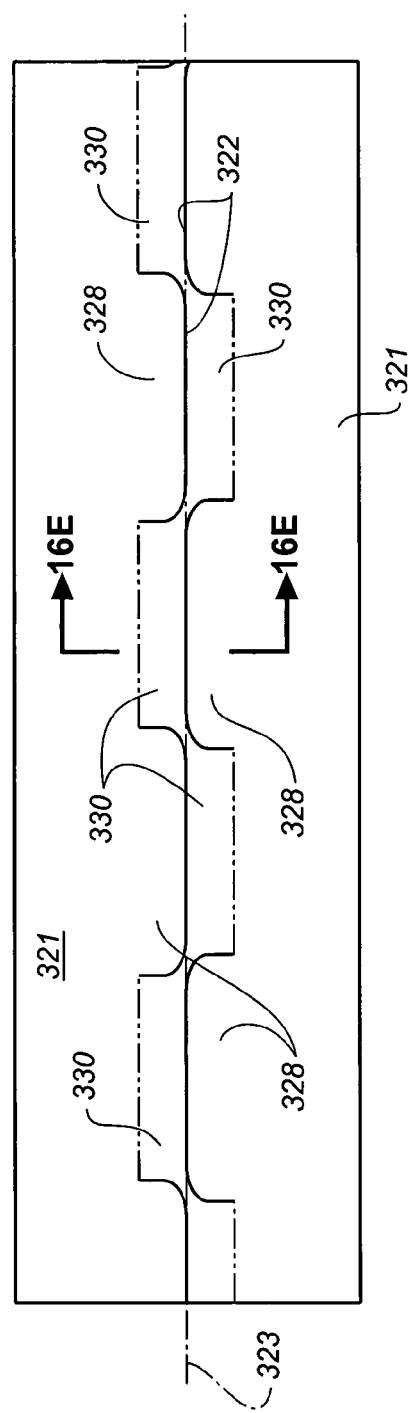
FIG._16A
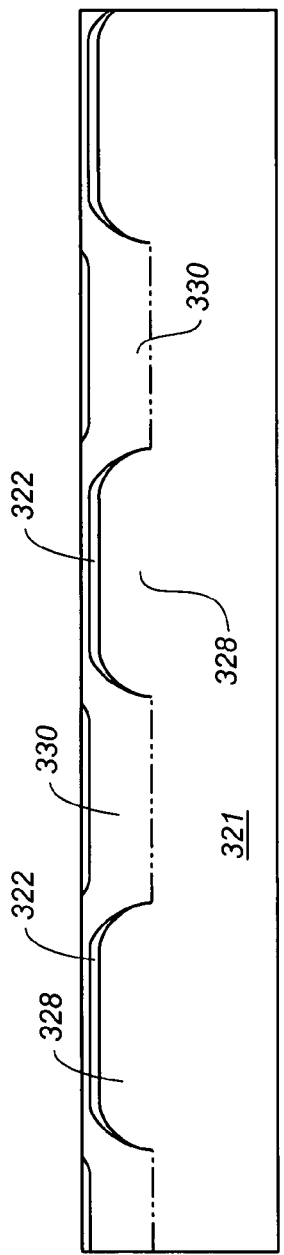
FIG._16C

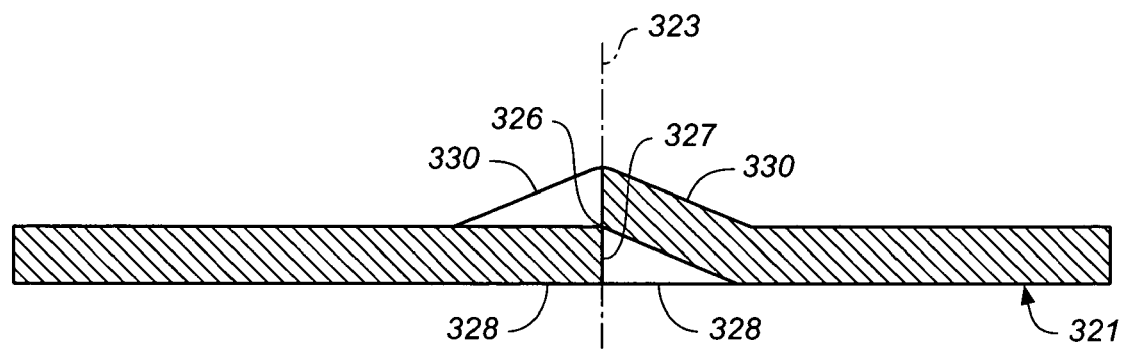
FIG._16E
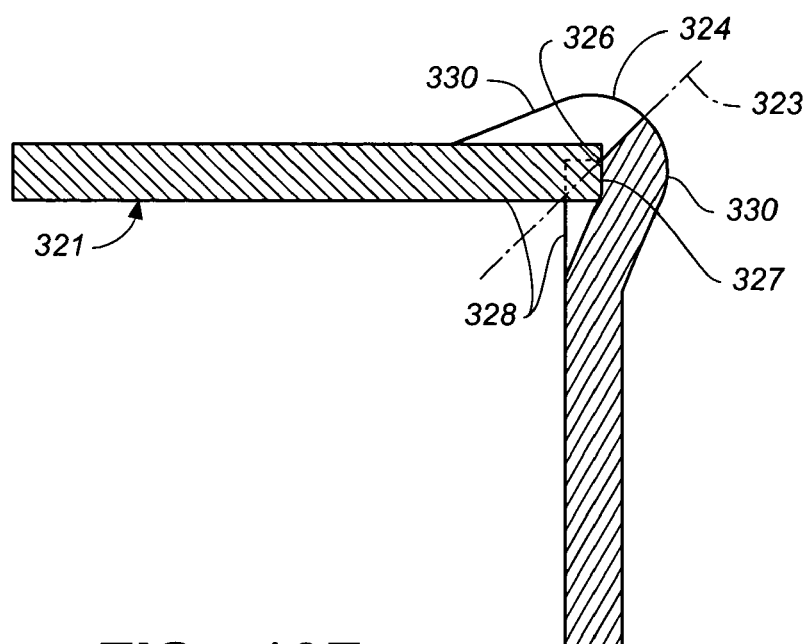
FIG._16F

METHOD FOR FORMING SHEET MATERIAL WITH BEND CONTROLLING DISPLACEMENTS

RELATED APPLICATIONS

This application is a Continuation-in-Part Application based upon a patent application Ser. No. 10/672,766 filed Sep. 26, 2003 and entitled TECHNIQUES FOR DESIGNING AND MANUFACTURING PRECISION-FOLDED, HIGH STRENGTH, FATIGUE-RESISTANT STRUCTURES AND SHEET THEREFOR, which was a Continuation-in-Part Application based upon a patent application Ser. No. 10/256,870, filed Sep. 26, 2002, and entitled METHOD FOR PRECISION BENDING OF SHEET MATERIALS, SLIT SHEET AND FABRICATION PROCESS, now U.S. Pat. No. 6,877,349 which was a Continuation-in-Part Application based upon parent application, Ser. No. 09/640,267, filed Aug. 17, 2000, and entitled METHOD FOR PRECISION BENDING OF A SHEET OF MATERIAL AND SLIT SHEET THEREFOR, now U.S. Pat. No. 6,481,259 B1.

TECHNICAL FIELD

The present invention relates, in general, to the precision folding of sheet material and, more particularly, relates to preparing the sheet material for bending using punching, stamping, roll-forming, embossing and similar processes, and then bending or folding the sheet into three-dimensional structures.

BACKGROUND ART

The present method and apparatus are based upon slitting and grooving geometries disclosed in depth in the above set forth related applications, which are each incorporated herein by reference in their entireties. In these related applications several techniques or manufacturing processes for forming slits and grooves that will precisely control bending of a wide variety of sheet material are disclosed, including laser cutting, water jet cutting, stamping, punching, molding, casting, stereo lithography, roll forming, machining, chemical-milling, photo-etching and the like. Some of these processes for fabricating bend-inducing slit geometries can be more expensive than others. For example, laser cutting will inherently involve additional cost as compared to, for example, punching or stamping, but punching and stamping may not be particularly well suited to sheet material of relatively heavy gauge.

The precision bending slit geometries of the above-identified related applications may be advantageously applied to numerous structures which are formed from relatively thin gauge sheet material. These structures tend to be more driven by the need for complex and precise bending patterns than they are by strength or fatigue resistance requirements. An example of one type of structure which can be formed of a relatively thin gauged sheet material, and yet requires precision and complex bending, is electronic component chassis, such as, computers, audio receivers, television sets, DVD players, etc.

As is noted in prior related application Ser. No. 10/672, 766, flat sheets, which are slit or grooved in accordance with the teachings of that prior related application, can have electrical components mounted to the flat sheets using "pick-and-place" techniques. The sheets may then be folded into enclosures or housings in which all of the components are spatially related in the desired positions inside the housing. The "pick-and-place" techniques greatly reduce cost, as does the ability to fold a flat sheet into a precisely dimensioned enclosure using relatively low-force bending techniques. While such electronic chassis can be formed using laser cutting or water jet cutting, there is considerable advantage if lower cost slit-forming or groove-forming techniques can be employed. Thus, lower cost fabrication processes such as punching, stamping, roll-forming or the like, will be highly advantageous to use with relatively thin gauge material if they do not lose the precision advantages that the slits geometries of the related applications can produce.

Moreover, slit-forming techniques, such as punching, stamping and roll-forming, can produce slits which have essentially zero kerf or slit width dimension, while laser and water jet cutting remove material and product slits having a measurable kerf or width dimension. Sheets having zero kerf slits have the advantage of being more closed along the bend line after the sheets are bent. Thus, they do not tend to open up as much during bending as sheets having measurable kerf dimensions. This makes the zero kerf sheets amenable to coating with a protective layer that will seal and close the bend line to allow them to be used in applications in which electromagnetic shielding is required or in which, corrosion resistance, attractive appearance, fluids need to be contained.

Accordingly, it is an object of the present invention to provide a method for preparing sheet material for precision bending along a bend line, which method is relatively low in cost and which adaptable to a wide range of applications employing sheet material.

A further object of the present invention is to provide a low cost method for preparing sheet material for bending, which method is capable of precise bending free of cumulative bending errors, is suitable for complex bending patterns, and requires only minimal force to effect bending.

Another object of the present invention is to provide a sheet of material for bending in which slits or grooves are formed using low-cost manufacturing processes that are capable of producing structures which can be sealed, are fluid-tight, corrosion resistant or must have an attractive appearance.

The bendable sheet material and bend-inducing sheet forming method of the present invention have other objects and features of advantage which will be set forth in more detail hereinafter in the following Best Mode of Carrying Out the Invention, as exemplified and illustrated by the accompanying drawing.

DISCLOSURE OF THE INVENTION

The method of preparing a sheet of material for bending along a bend line of the present invention is comprised, briefly, of the step of forming at least one displacement in the thickness direction of the sheet of material with the portion of the periphery of the displacement closest to the bend line providing an edge and an opposed face configured and positioned to produce edge-to-face engagement of the sheet of material during bending. The displacement is preferably formed using one of a punching, stamping, roll-forming, embossing, chemical milling or etching process in which dies, machine tools, a knife or chemical agent form a slit or shear line of zero kerf or a groove in the sheet material. When dies are employed, the periphery of the displacement caused by the die, which is closest to the bend line is sheared at least partially, and often completely, through the thickness dimension of the sheet of material proximate the bend line. Most preferably, a plurality of displacements are formed along the bend line, with alternate displacements being positioned on opposite sides of the bend line. In the most preferred form the periphery which is closest to the bend line is, in fact, superimposed on the bend line so that the jog distance between displacements on opposite side of the bend line is essentially zero. The displacements, however, can have a jog distance in the range of about −0.5 to about +0.5 times the thickness dimension of the sheet. The displacements also may be plastically deformed by die sets to produce the opposing edge and face structures. Upon bending, the sheet of material may not fracture or rupture along the plastically deformed displacements, so that the bend will be maintained as a fluid-tight continuous structure along the bend line, or it may rupture to provide a face and opposed edge similar to sheared sheets. While it is preferred to displace the tongues which are defined inside the slits or grooves, it also is possible to displace the areas longitudinally between the slits or groove and still achieve edge-to-face precision bends. Moreover, the bending direction is preferably in the direction of displacement of the tongues, but if lower precision can be tolerated bending can be in the opposite direction.

A sheet of material suitable for bending along a bend line is also provided which comprises, briefly, a sheet having at least one displacement in the thickness direction of the sheet, with a portion of the displacement closest to the bend line providing an edge and an opposing face configured to produce edge-to-face engagement of the sheet of material on opposed sides of the portion of the periphery during bending. Most preferably a plurality of displacements are positioned along the bend line on alternating sides of the bend line. A continuous layer of coating material can be placed on the sheet before bending to further insure that resulting bend will be fluid-tight, corrosion resistant and attractive. The displacements in the sheet of material can extend partially through the sheet or completely through it, and the sheet can be bent in the direction of the displacements for maximum precision or in an opposed direction by relying on the oblique bending straps to control the precision. Optionally, but less desirably, the sheet may be bent in the opposite direction when the precision achievable by edge-to-face bending is not required.

DESCRIPTION OF THE DRAWING

FIG. 1A is a fragmentary, top plan view of a sheet of material having bend controlling displacements formed therein in accordance with the present invention.

FIG. 1B is an enlarged, fragmentary, end elevation view, in cross section of the sheet of FIG. 1A, taken substantially through the plane of line 1B—1B in FIG. 1A.

FIG. 1C is a cross sectional view corresponding to FIG. 1B with the sheet having been bent by 90 degrees from the flat condition of FIG. 1B.

FIG. 1D is a cross sectional view corresponding to FIG. 1B of an alternative embodiment of the sheet in which a protective coating adhered to the sheet of material.

FIG. 1E is a cross sectional view corresponding to FIG. 1C of the bent coated sheet of FIG. 1D.

FIG. 2A is a fragmentary, top plan, schematic view of a sheet of material corresponding to FIG. 1A with only a single displacement or sheared tongue being shown for ease of understanding.

FIGS. 2B and 2C are views corresponding to FIGS. 1B and 1C of the sheet shown in FIG. 2A.

FIG. 3A is a fragmentary, top plan, schematic view of a sheet of material corresponding to FIG. 1A with only a single displacement or sheared tongue being shown, which tongue has been sheared and displaced beyond the sheet thickness dimension.

FIGS. 3B and 3C are views corresponding to FIGS. 1B and 1C of the sheet of FIG. 3A.

FIG. 4A is a fragmentary, top plan, schematic view of a sheet of material corresponding to FIG. 1A having an alternative embodiment of a single tongue having a reinforced central tongue deformation.

FIGS. 4B and 4C are views corresponding to FIGS. 1B and 1C of the sheet of FIG. 4A.

FIG. 4D is a cross section view taken substantially along the plane of line 4D—4D in FIG. 4.

FIG. 5A is a fragmentary, top plan, schematic view of a sheet of material corresponding to FIG. 1A having an alternative embodiment of a single tongue which has been plastically deformed and displaced in the thickness direction of the sheet.

FIGS. 5B and 5C are views corresponding to FIGS. 1B and 1C of the sheet of FIG. 5A.

FIG. 5D is a view corresponding to FIG. 5C in which the sheet has fractured or ruptured during bending.

FIG. 6A is a fragmentary, top plan schematic view of a sheet of material corresponding to FIG. 1A in which an alternative embodiment to a displacement having a continuous periphery is shown partially sheared through the thickness dimension of the sheet.

FIGS. 6B and 6C are views corresponding to FIGS. 1B and 1C of the embodiment of the sheet of FIG. 6A.

FIG. 7A is a fragmentary, top plan, schematic view of a sheet of material corresponding to FIG. 6A in which the displacement in the sheet has been sheared only partially through one side of the periphery and completely through an opposite side of the periphery.

FIGS. 7B and 7C are views corresponding to FIGS. 1B and 1C of the sheet of FIG. 7A.

FIG. 8 is a front elevation view of a bent sheet of material having displacements of the type shown in FIGS. 2A–2C with a bend-covering shin guard, shown in broken lines, and illustrating upstanding securement tabs.

FIG. 9 is an end elevation view of the sheet of material of FIG. 8 with the shin guard shown in solid lines mounted to the securement tabs.

FIG. 10 is a front elevation view of an alternative embodiment of bent sheet of material with a shin guard shown in broken lines and an attachment structure.

FIG. 11 is an end elevation view of the sheet of material of FIG. 10 with the shin guard shown in solid lines mounted to the sheet by the attachment structure.

FIG. 12A is a side elevation schematic view of a sheet of material formed in accordance with the present invention and positioned on a fixed tool plate for bending by a rotary cylinder and movable linkage.

FIG. 12B is a side elevation schematic view of the sheet of material of FIG. 12A after partial bending of the sheet on the tool plate.

FIG. 12C is a side elevation schematic view of the sheet of material of FIG. 12A after a 90 degree bend.

FIG. 13A is a side elevation schematic view of a sheet of material formed in accordance with the present invention and positioned on a fixed tool plate for bending by a pneumatic bending bladder.

FIG. 13B is a side elevation schematic view of the sheet of material of FIG. 13A after a 90 degree bend.

FIG. 14A is a top plan, schematic view of a sheet of material that has been grooved in accordance with the present invention.

FIG. 14B is an end view of the sheet of FIG. 14A.

FIG. 14C is a side elevation view of the sheet of FIG. 14A with the half of the sheet above the bend line shown bent outwardly of the page.

FIG. 14D is an end view of the sheet as bent in FIG. 14C.

FIG. 15A is a top plan schematic view of a sheet of material that has been grooved and provided with stress relieving features in accordance with an alternative embodiment of the present invention.

FIG. 15B is an end view of the sheet of FIG. 15A.

FIG. 15C is a side elevation view of the sheet of FIG. 15A with the half of the sheet above the bend line shown bent outwardly of the page.

FIG. 15D is an end view of the bent sheet of FIG. 15C.

FIG. 16A is a top plan schematic view of a sheet of material having shear lines controlling bending and having the areas between longitudinal adjacent shear lines on the same side of the bend line displaced to produce edge-to-face bending.

FIG. 16B is a side elevation view of the sheet of FIG. 16A with the upper half of the sheet shown bent into the page.

FIG. 16C is a top plan schematic view of bent sheet of FIG. 16A.

FIG. 16D is an end view of the bent sheet of FIG. 16C.

FIG. 16E is an enlarged, cross sectional view of the sheet of FIG. 16A, taken substantially along the plane of line 16E—16E in FIG. 16A.

FIG. 16F is a cross sectional view of the sheet of FIG. 16E as bent by ninety degrees.

BEST MODE OF CARRYING OUT THE INVENTION

Reference will now be made in detail to the preferred embodiments of the present invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention, as defined by the appended claims.

The present method and apparatus for precision bending of sheet material is based upon the slitting geometries disclosed in the above-identified prior related applications, which are incorporated herein by reference in their entireties.

As noted in connection with the prior related applications, processes for forming the slits which will control and precisely locate the bending of sheet material include such processes as punching, stamping, roll-forming, machining, photo-etching, chemical machining and the like. These processes are particularly well suited for lighter weight or thinner gauge material, although they also can be employed for sheet material of relatively heavy gauge. The thicker or heavier gauged materials often are more advantageously slit or grooved using laser cutting or water jet cutting equipment.

As described in the prior related applications, one highly advantageous application for the precision bending of sheet material is in connection with electronic component chassis. Such chassis often are highly complex so as to enable the positioning of a multiplicity of components in three-dimensional arrays inside the eventual housing for the electronic equipment. Since laser cutting and water jet cutting are both somewhat more expensive, it is particularly desirable to be able to form chassis for electronic equipment, and numerous other lower cost housings and the like, using-low cost, high-production techniques such as punching, stamping, roll forming and the like. The present application, therefore, illustrates how these lower cost fabrication processes can be applied to relatively thinner gauged sheet material with great advantage.

Turning now to FIGS. 1A–1C, a sheet of material generally designated 21, is shown in FIG. 1A having a plurality of slits 22 positioned proximate and along a bend line 23. The slits can be seen to have ends which curve away from bend line 23, and the curved slit ends define therebetween bending straps 24 that have center lines that extend obliquely across bend line 23, in a manner described in substantial detail in prior related application Ser. No. 10/672,766. As will be seen, longitudinally adjacent slits 22 are positioned alternatively on opposite sides of bend line 23 along the length of the bend line, which is the preferred arrangement, but is not absolutely required.

As also may be seen in FIG. 1A, slits 22 are positioned in a laterally displaced positions from bend line 23, but this has been done primarily to illustrate the position of the bend line. In the most preferred form of the invention, when light gauge materials are being prepared for bending, slits 22 will be substantially superimposed on bend line 23. This is preferred because it facilitates the use of the same die sets for a wider range of sheet material thicknesses.

As described in prior related application Ser. No. 10/672, 766, the "jog" distance between slits 22 is defined as the lateral distance between the slits on opposite sides of the bend line. In the most preferred form of the embodiments in the present application, therefore, the jog distance is substantially equal to zero, that is, the slits are positioned precisely on bend line 23 so that there is no lateral spacing between slits on the opposite sides of the bend line, except at the curved ends. As indicated in the prior related applications, the jog distance between slits relative to bend line 23 is preferably less than the thickness dimension of sheet 21. Obviously, a jog distance of zero meets that requirement.

Additionally, as can be seen for slits 22a and 22b at the right hand end of sheet 21, a negative jog distance also can be employed. As will be seen, slit 22a extends across bend line 23, as does slit 22b. This is acceptable within the teaching of the present invention and will produce the edge-to-face bending along bend line 23 that is desired for precise, controlled bending. For the thinner gauged materials typically employed in electronic equipment chasses, the jog distance between slits 22 is preferably in the range of about −0.5 to about +0.5 times the thickness dimension, t, (FIG. 1B) of sheet 21. As the jog distance between slits becomes increasingly negative over about −0.5 times the thickness of the sheet of material, there is a tendency for the sheet to bend along two bend lines, which bends are positioned at the edges of the slits, rather than a single bend line positioned between the edges of the slits. At about 0.8 times the thickness of the sheet, for example, the two bend line phenomena has been seen to occur in 0.060 sheet metal.

When a negative jog distance is employed with slits 22 having a zero kerf dimension, the slit will remain relatively closed along its length even after a 90 degree bend. If the slit is formed with a kerf, for example, by laser cutting, and a negative jog distance is employed, there is a tendency for the material on opposite sides of the slit to separate or "daylight"

upon bending, for example, to 90 degrees. This, however, can be entirely acceptable, depending upon the application.

As will be described in considerable detail below, the most preferred approach to punching or stamping slits into sheet 21 is to displace a tongue or enclosed area of slug in the thickness direction of the sheet by dies which shear the sheet. It will be understood from prior related applications, however, that slits 22 also can be formed as shear lines or slits in which there is no displacement of the sheet, for example, by using a knife, rather than a die that also displaces a portion of the sheet. One of the advantages of forming a displacement in the sheet, rather than slitting it with a knife, is that edge-to-face sliding of material on opposite sides of slits 22 is reduced or not required. The displacement of the sheet also reduces the bending forces required by insuring that each edge and face will move in the right direction during bending.

In the preferred form, slits 22 are formed by displacement in a thickness direction so that a portion of the periphery of the displacement closest to bend line 23 provides an edge 26 and an opposed face 27 configured and positioned to produce edge-to-face engagement of the sheet of material on opposite sides of the periphery during bending. As shown in FIG. 1B, a D-shaped tongue 28 has been downwardly displaced to provide a face 27 against which a lower corner 26 or edge on the opposite side of slit 22 from tongue 28 will engage when sheet 21 is bent. As illustrated best in FIGS. 1B and 1C, a portion of the slit periphery is superimposed on the plane of bend line 23. The next slit, which is into the page in FIG. 1B, has a similar D-shaped tongue 28a which has been downwardly displaced to provide a face 27a against which an edge 26a will engage.

When sheet 21 is bent, for example, by 90 degrees, edges 26, 26a pivot around and engage faces 27,27a at about a midpoint in the faces. As bending continues, they act as opposed fulcrums which are positioned on bend line 23 (that can be seen in FIG. 1C to have rotated by 45 degrees). Thus, almost immediately as the bend begins, the edges 26,26a are rotated into engagement with faces 27,27a, with result that bending is very precisely controlled to occur about bend line 23. The obliquely oriented bending straps 24 pull and maintain edges 26,26a against faces 27,27a during bending to maintain the fulcrums in contact with the opposed faces. This edge-to-face engagement is described in even more detail in the prior related applications.

The illustrations in FIGS. 1A and 1B are greatly enlarged in thickness to enable the edge-to-face contact to be more clearly illustrated. It will be understood, however, that sheet 21 can be relatively thin, for example, 0.060 inches, with tongues 28 downwardly displaced in the thickness dimension by only 0.03 inches. These dimensions, however, obviously are not critical other than to indicate that in thin sheet material the displacements of the tongue material are not very large.

As will be seen from FIG. 1C, edges 26,26a tend to be held by straps 24 into tight engagement with faces 27,27a. Thus even at the slits 22 the sheet material on both sides of the periphery of the slits closest to the bend line will be in contact with each other over the length of the slits. This tends to allow the bent sheet to be used in applications, for example, where electromagnetic shielding is required or even in applications where fluids need to be contained. It is preferred, however, in order to further insure a fluid-tight bend that a continuous, preferably flexible, coating material be adhered or bonded to the sheet across the area of slits 22. This embodiment of the present invention can be seen in FIGS. 1D and 1E, which correspond to FIGS. 1B and 1C. A continuous layer of a flexible sealant or coating 29 can be seen to have been deposited, adhered or bonded to downwardly facing surfaces of sheet 21 across the slits. This is most preferably accomplished while sheet 21 is in a substantially flat, but sheared, condition, as shown in FIG. 1D. Upon bending to the position of FIG. 1E, the coating 29 will tend to be crushed or compressed between faces 27 and 27a and the underneath side of the sheet of material. Most protective coatings, such as epoxies and paints, will be sufficiently flexible and compressible to accommodate the compression and bending of the sheet without fracturing. Thus, coating 29 will insure that there is a continuous surface that is be fluid-tight. Obviously, it would also be possible within the scope of the present invention to simply spray a coating on the bent sheet of FIG. 1E, but for many applications applying coating 29 to the flat, but punched, stamped or roll-formed sheet is more preferred since the bend lines 23 can be at complex interior locations that would be hard to coat after bending.

In cases where full coverage of both sides of the street with a flexible sealing coating is desired, one generally applies (prior to bending) a flexible coating 29 to both sides of the sheet in the embodiment of bent D-shaped tongues 28 as shown in FIGS. 2A–2C. As can be clearly seen, the bent tongue 36 rotates with respect to the sheet about edge 38. This leaves the coating in tact and continuous on the top or upwardly facing surface of the sheet, while the coating on the under or downwardly facing surface is compressed under tab end (37) as noted in FIGS. 1D and 1E.

As will be apparent to one skilled in the art, the displacement or tongues 28 of FIGS. 1A–1D can be readily formed by punching, stamping, embossing and roll-forming processes. A set of dies can be used to punch down tongues 28 with a portion of the periphery forming the bend-controlling slit 22 in the opposed edges and faces. As shown in the drawing, the phantom line 31 is not a clearly defined shoulder, but is the point at which tongue 28 reaches the top surface of the sheet and has not been downwardly displaced. FIGS. 1A–1C show a tongue or displacement 28 which has essentially been half sheared by the punching dies so that the upper surface of the displacements 28 have been displaced downwardly to about one-half the thickness dimension of the sheet, which causes the dies on the lower half of the edge to shear away and complete faces 27 and 27a.

In FIGS. 2A–2C, the process is the same, only the punching or roll-forming device have sheared displacements or tongues 36 downwardly by the full thickness, t, of the sheet. Thus a face 37 on the periphery of displacement or tongue 36 is now displaced until the upper edge of face 37 is positioned at edge 38 on the opposite side of slit 22. This tends to produce a point-to-point contact at edge 38 with the corner of face 37 during bending, as shown in FIG. 2C. Nevertheless, the edge fulcrum 38 on the edge of face 38 again precisely controls the location of bending, together with the opposed tensioning of oblique bending straps 24 along bend line 23.

In FIGS. 3A–3C, sheet 21 has been sheared during punching so that a face 42 of displacement or tongue 41 is now down below lower surface 43 of the sheet of material. Edge 44, therefore, is not engaged with opposite face 42 and will not engage face 42 during bending, as best can be seen in FIG. 3C. Instead, control of the position of the bend relative to bend line 23 is accomplished by opposite, obliquely-extending, bending straps 24. Use of bending straps 24 to control the positioning of the bend of the sheet of material is less precise than can be achieved through edge-to-face engagement of opposite sides of the slit periphery during bending. Nevertheless, oblique bending straps 24 can produce reasonably precise bends that require low bending forces and the bending straps do not excessively twist or stress during bending. Accordingly, for applications where there is more tolerance as to the dimensional requirements of the resultant product, over-displacement of tongues 41 to the FIG. 3B position can be employed. It should be noted that sets of dies can be used to progressively shear displacement or tongue 41 to the position of 3B and then displace tongue 41 upwardly at a second die station to the position of FIG. 2B or 1B. If, for example, it is desired or necessary to be certain that the downwardly displaced tongue has been sheared completely through and yet is repositioned so that the edge will engage the opposed face upon bending, a two-station operation will be performed.

In the embodiment of FIGS. 4A–4D, a fully sheared displacement or tongue 51 is shown which corresponds to the full shear of the tongue of FIGS. 2A–2C. Tongue 51, however, is formed in FIGS. 4A–4D with a downwardly deformed central reinforcing portion 52. This provides for engagement between lower edge 26 with face 27 at a corner or point located on bend line 23. Even further downwardly displaced central portion 52 of tongue 51 insures that over bending the sheet will be limited.

Turning now to FIGS. 5A–5D, a displacement of the sheet material to provide an edge and opposed face by plastic deformation, rather than shearing, is shown. Sheet 21 has been downwardly displaced at 61 typically by stamping or roll-forming dies that are not provided with sharp edges so that the downward displacement has resulted in a plastic deformation of area 62 of the sheet. Upon bending, the bending strips 24 will again be tensioned or bent and thereby pull the sheet on opposite sides of the bend line 23 together so that area 62 deforms without shearing or fracturing. In effect, a virtual face on the end of displacement 61 engages a virtual edge 63 on bend line 23 so as to precisely control the location of the bend. This approach is best suited to ductile sheet material and it has the advantage of resulting in a fluid-tight bend.

In FIG. 5D an alternative is shown in which fracturing or rupturing occurs at face 64 so that the virtual face becomes an actual face 64. In terms of precision bending, it does not matter whether or not fracture 64 occurs and edge 63 is bending off of an actual face 64 or a virtual face at the end of downward displacement of tongue 61.

In FIGS. 6A–6C and 7A–7C, the displacements have a closed periphery or are formed as slugs of material that are downwardly displaced on alternative sides of bend line 23. It will be understood that for ease of illustration a plurality of these slug-type displacements have not been shown, but they would be positioned as shown in FIG. 1A, preferably with the peripheral side closest to the bend line positioned in superimposed relation to bend line 23. Such oval-shaped displacements or slugs are readily amenable to punching, stamping, roll-forming and similar high production, low-cost fabrication processes. The slug may take various shapes including 'D' shape and non-uniform shapes that produce diagonal straps and edge-to-face engagement.

In FIG. 6A, sheet 22 has been formed with an oval-shaped displacement 71 having a portion of its periphery 22 closest to bend line 23 downwardly displaced as shown in FIGS. 6B and 6C. The downward displacement or shearing of displacement 71 produces a face 27 against which lower edge 26 bears. As the sheet is bent, face 27 pivots about face 26 to the position shown in FIG. 6C and oblique straps 24 between the ends of longitudinally adjacent oval displacements 71 are bent as described above for straps 24 between tongues 28. Since this a half shear of displacement 71, the result is essentially the same as that achieved in FIGS. 1A–1C except there is a remote side 72 of the periphery of displacement 71 that also is sheared. As can be seen from FIG. 6B, remote side 72 is in the oval bore punched into the sheet so as to support face 27 during pivoting of edge 26 for precise location of bend on bend line 23.

FIGS. 7A–7C are similar to FIGS. 6A–6C only the portion of periphery of the oval displacement or slug 81 on bend line 23, namely, the bend controlling slit 22, has been sheared by the full thickness of the sheet, while remote peripheral side 82 has only been half sheared. Edge 26, therefore, pivots on the upper corner of face 27 in a manner similar to that shown in FIGS. 2A–2C.

Although not shown, oval displacements or slugs 71 and 81 also can be completely punched or stamped out of sheet 21 to leave oval holes along the sheet. Such holes will define obliquely extending bending straps 24 skewed in opposite directions at opposite ends of each of the holes. These bending straps extend across the bending line 23 and will again produce bending along bending line 23, but without edge-to-face engagement because the slug faces 27 are now gone. While providing less precision, such an embodiment will produce reasonably accurate bending along bending line 23.

In FIGS. 8–11, two alternative embodiments of the punched or stamped sheets of the present invention are shown in which "shin guards" have been added to the corners of the bent sheets. In prior related application Ser. No. 10/672,766, the use of corner coverings over the bend lines so as to present a smooth corner surface was described. Such coverings are referred to herein and in prior related applications as "shin guards," and FIGS. 8–11 illustrate two embodiments of the manner in which shin guards can be secured to the corners of bent sheets.

In FIG. 8, a sheet of material 21 has been bent at a right angle. Sheet 21 has a plurality of tongue displacements 28 constructed as shown in connection with FIGS. 2A–2C. The upper corner of faces 27 of such displacements are in edge-to-face engagement with the edge 26 on the other side of the periphery of tongue displacement 28. Punched into sheet 21 are a plurality of outwardly extending securement tabs 91 which are used to couple shin guard 92 around the corner of the bent structure and across bend line 23. In the embodiment shown in FIGS. 8 and 9, shin guard 92 includes a cavity 94 dimensioned to receive tab 91, and the cavity preferably has a tapered entrance surface 96 which leads to an outwardly facing shoulder 97 that engages with inwardly facing shoulder 98 on the tabs 91. The shin guard, therefore, can simply be positioned over the tabs 91 and then urged toward the bent sheet 21 to cause shoulders 97 to snap in behind inwardly facing surfaces 98 of the tabs and thereby secure the shin guard to the corner of the bent structure. Alternatively, the shin guard may be slid in place along the corner.

In FIGS. 10 and 11, openings 101 are periodically provided in sheet material 21 and a shin guard 103 is provided having tapered and necked protrusions 104. Protrusions 104 are urged through openings 101 so that an outwardly facing inwardly shoulder 106 snaps in behind inwardly facing surface 107 of the bent sheet 21. Again, the displacements or tongues 28 are constructed as shown in connection with FIGS. 2A–2C.

One of the important features of the slit or displacement geometries described in this application, and the prior related applications, is that folding of the sheet of material requires relatively small forces. Bending straps 24 preferably comprise less than a majority of the material along the bend line and they are twisted and bent during bending of the sheet material. The fulcrum between edge 26 and face 27 and the long lever arm of the sheet on both sides of the bend line, makes bending of the sheet with relatively low force very simple. It is possible, for example, to place an edge of the sheet in a slot or groove and then manually apply a force to the opposite edge to easily bend the sheet. In most cases where the sheet material would be bent for an electronic chassis, the sheet can be bent by hand. It is most preferred, however, to be able to perform the bending in an automatic machine-implemented process, for example, in a progressive die assembly in which the sheet is prepared for bending at a first station by forming displacements along the bend line, and the sheet is thereafter moved to another station and then bent by relatively low-force bending apparatus.

FIGS. 12A–C show a mechanical bending apparatus in which a fixed tool plate 110 supports a sheet 21, which has been prepared for bending in the manner described above. A bending cylinder 111 is mounted to a movable linkage or arm 112 for downward displacement, as shown by arrow 113. As cylinder 111 is brought down against sheet 21, an edge 114 of a notch 116 in the cylinder engages sheet 21 and begins to rotate the cylinder and linkage 112 in a clockwise direction. As the linkage 112 continues to move downwardly, cylinder 111 continues to rotate to the position 21 so as to form shown in FIG. 12C. Alternatively, the tool plate 110 can be movable or both tool plate 110 and cylinder 111 can be movable.

An alternative approach shown in FIGS. 13A and 13B is for tool plate 110 to have a pneumatic bladder 121 positioned over edge 122 of the tool plate. As bladder 121 is inflated to the condition shown in FIG. 13B, it engages the unsupported portion of sheet 21 and drives it down to the bent position shown in FIG. 13B. The low bending force required to effect the bend of FIG. 13B will easily permit the use of pneumatic bending systems.

Other bending equipment suitable for use for bending the sheets of the present invention would include a press brake.

In FIGS. 14A–14D and 15A–15D, the use of machining, chemical milling or photo etching of grooves into the sheet using geometries of the prior related applications can be described. In FIG. 14A, a sheet 221 is formed with a plurality of grooves 222 along a bend line 223 as above taught in connection with displacements or shear lines 22. In the preferred form, an edge 226 of grooves 222 falls on or is substantially superimposed relative to the plane of bend line 223. Grooves 222 alternate on opposite sides of bend line 223 and between longitudinally adjacent grooves 222 are bending straps 224, which will be seen to extend obliquely across bend line 223.

In FIGS. 14C and B, sheet 221 has been bent out of the page in FIG. 14C or toward grooves 222. The result will not be edge-to-face engagement of actual fulcrums to produce precise bending, but instead the bending will be caused by the equal tension on oblique bending straps 224, which will produce bending substantially along bend line 223. The precision of bending toward the grooves will not be quite as good as can be achieved with edge-to-face bending, but the precision is quite acceptable for many applications, for example, in connection with electronic chassis components.

In this regard, it should be noted that the embodiments of the present invention shown in FIGS. 1A–7C are all shown as having been bent in the direction of the displacement of the tongues or slugs formed in the sheet during preparation of the sheet for bending. Those same embodiments, however, could also be bent in an upward direction, that is, against the direction of displacement of the tongues or slugs during slitting of the sheets. Such reverse bending will cause the bending straps 24 to control the precision of the bend, rather than edge-to-face engagement, but the straps will give a reasonably precise bend along the bend line 23.

Sheet 221 of FIGS. 15A–15D has been prepared for bending by grooving, with the grooves having stress relieving lands or areas 228 at each end. Again, the grooves 222*a* do not go through the complete thickness of the sheet and they define bending straps 224*a* that are oblique to bending line 223*a*. Again, the sheet has been bent into the grooves, rather than away from them, and straps 224*a* are used to control the position of the bend along bend line 223*a*.

Turning now to FIGS. 16A–16F, an embodiment of the present invention is shown in which the material between longitudinally adjacent arcuate slits on the same side of the bend line is displaced, rather than the tongues or slugs defined by the slits. In FIG. 16A a sheet of material 321 is shown having a plurality of slits 322 positioned on alternating sides of bend line 323. Obliquely extending bending straps 324 are provided, and slits 322 define tongues 328 and intermediate areas 330 on each side of the arcuate slit 322.

Unlike the embodiments previously described, however, D-shaped tongues 328 are not displaced but remain in the plane of sheet 321. Instead, the material or area 330 longitudinally adjacent to or between tongues 328 on the same side of bend line 323 is upwardly displaced, as best may be seen in FIG. 16E. Thus, during the punching, roll-forming, embossing, stamping or the like, the shear which produces slits 322 and faces 327 is an upward shear in which area 330 is upwardly displaced from the plane of sheet 321. The lower corner or edge 326 of upwardly displaced area 330 bears on the corner of face 327. As the sheet is bent to the position of FIG. 16F, edge 326 will slide down face 327 and bend bending strap 324 precisely about rotated bend line or plane 323. The resultant bent sheet is also shown in FIGS. 16C and D, although they are rotated by 90 degrees relative to FIG. 16F.

As was above described in connection with the other embodiments, the embodiment of FIGS. 16A–16F employs a displacement process in which the sheared slits 322 have geometries according to the prior related applications. Preparation of sheets for low-force precise bending can be accomplished using low-cost fabrication techniques such as punching, stamping, roll-forming and the like.

The invention claimed is:

1. A method of preparing a sheet of material for bending along a bend line comprising the step of:

forming at least one displacement in the thickness direction of the sheet of material with a portion of the periphery of the displacement closest to the bend line providing an edge and an opposed face configured and positioned to produce edge-to-face engagement of the sheet of material during bending;

wherein the forming step shears the sheet of material partially through its thickness dimension along the portion of the periphery; and wherein the forming step shears the sheet of material sufficiently through the thickness dimension along the portion of the periphery to produce fracturing through the entire thickness dimension of the sheet of material upon bending.

2. The method as defined in claim 1 wherein, the forming step plastically deforms the sheet of material to provide an edge and an opposed face configured so as not to fracture through the thickness dimension upon bending of the sheet material.

3. The method as defined in claim 1 wherein, the forming step is accomplished using one of a stamping process, a punching process, a roll forming process, a shearing knife-based and an embossing process.

4. The method as defined in claim 1 wherein, during the forming step, forming a plurality of displacements in the sheet of material along the bend line with each displacement having a periphery portion proximate the bend line to provide a plurality of edges and opposed faces for edge-to-face bending of the sheet of material.

5. The method as defined in claim 4 wherein, during the forming step, forming the plurality of displacements along the bend line with each displacement having the periphery portion substantially superimposed on the bend line.

6. The method as defined in claim 4 wherein, during the forming step, forming a plurality of displacements in the sheet of material with the periphery portion of at least one displacement being positioned on each side of the bend line.

7. The method as defined in claim 6 wherein, during the forming step, positioning the periphery portion of displacements on opposite side of the bend line at a jog distance from each other less than the thickness dimension of the sheet of material.

8. The method as defined in claim 6 wherein, during the forming step, forming the peripheral portions of displacements on opposite sides of the bend line to define bending straps oriented to extend obliquely across the bend line.

9. The method as defined in claim 1, and the step of: after the forming step, adhering a layer of coating material to the sheet of material across the portion of the periphery of the displacement.

10. The method as defined in claim 9 wherein, the adhering step forms a continuous layer of flexible coating material.

11. The method as defined in claim 4 wherein, during the forming step, shearing the portion of the periphery of each displacement at least partially through the thickness dimension of the sheet of material.

12. The method as defined in claim 1 wherein, the displacement is a tongue extending from the sheet of material up to the portion of the periphery.

13. The method as defined in claim 1 wherein, the displacement is an area longitudinally adjacent to the portion of the periphery.

14. A method of preparing a sheet of material for bending along a bend line comprising the step of:
forming at least one displacement in the thickness direction of the sheet of material with a portion of the periphery of the displacement closest to the bend line providing an edge and an opposed face configured and positioned to produce edge-to-face engagement of the sheet of material during bending;
wherein during the forming step, forming a plurality of displacements in the sheet of material along the bend line with each displacement having a periphery portion proximate the bend line to provide a plurality of edges and opposed faces for edge-to-face bending of the sheet of material;
wherein during the forming step, forming a plurality of displacements in the sheet of material with the periphery portion of at least one displacement being positioned on each side of the bend line;
wherein during the forming step, positioning the periphery portion of displacements on opposite side of the bend line at a jog distance from each other less than the thickness dimension of the sheet of material; and
wherein the jog distance is in the range of about −0.5 to about +0.5 times the thickness dimension of the sheet of material.

15. The method as defined in claim 14 wherein, the forming step shears the sheet of material partially through its thickness dimension along the portion of the periphery.

16. The method as defined in claim 15 wherein, the forming step shears the sheet of material entirely through the thickness dimension along the portion of the periphery.

17. A method of preparing a sheet of material for bending along a bend line comprising the step of:
forming at least one displacement in the thickness direction of the sheet of material with a portion of the periphery of the displacement closest to the bend line providing an edge and an opposed face configured and positioned to produce edge-to-face engagement of the sheet of material during bending;
wherein during the forming step, forming the displacement with a reinforcing rib extending in a direction opposed to the direction of the displacement.

18. A method of preparing a sheet of material for bending along a bend line comprising the steps of:
forming a plurality of load-supporting face structures extending longitudinally proximate the bend line;
forming a plurality of edge structures extending in positions opposed to the face structures; and
during the forming steps, forming the edge structures and the face structures to define a plurality of bending straps extending obliquely across the bend line;
wherein the forming steps are accomplished by forming the face structures and the opposed edge structures in positions and with configurations producing engagement of the edge structures with the face structures during bending of the sheet of material along the bend line; and
wherein the forming steps are accomplished by forming the face structures and the opposed edge structures to alternate on opposite sides of the bend line in positions having a jog distance across the bend line of between about −0.5 to about +0.5 times the thickness of the sheet material.

19. The method as defined in claim 18 wherein, the forming steps are accomplished by displacing the sheet of material in a thickness direction to produce the plurality of face structures and opposed edge structures.

20. The method as defined in claim 19 wherein, the displacing step is accomplished using one of a stamping process, a punching process, a roll-forming process, a pressing process and an embossing process.

21. The method as defined in claim 18 wherein, the shearing step is accomplished using one of stamping dies, a knife, punching dies, embossing dies and roll-forming dies.

22. The method as defined in claim 18 wherein, the shear lines are one of D-shaped and oval-shaped.

23. The method as defined in claim 18 wherein,
the shear lines are elongated along the bend line and extend substantially parallel to the bend line in a central portion and have end portions which curve away from the bend line.

24. A method of bending a sheet of material comprising the steps of:
forming a plurality of displacements in the thickness direction of the sheet of material with a portion of the periphery of each displacement closest to the bend line providing an edge and opposed face configured and positioned to produce edge-to-face engagement of the sheet of material on opposite sides of the portion of the periphery during bending; and
bending the sheet of material along the bend line;
wherein the forming step shears the portion of the periphery partially through the thickness dimension of the sheet of material; and
the bending step fractures the portion of the periphery through the remainder of the thickness dimension of the sheet of material.

25. The method as defined in claim 24 wherein,
the forming step is accomplished by using one of: a stamping process, a roll-forming process, a punching process and an embossing process.

26. The method as defined in claim 24 wherein,
during the bending step, the sheet of material is bent in the direction of the displacements.

27. The method as defined in claim 24 wherein,
during the bending step, the sheet of material is bent in a direction opposed to the direction of the displacements.

28. The method as defined in claim 24 wherein,
the bending step is accomplished by moving at least one of a die and a tool plate toward each other with the sheet of material mounted therebetween on the tool plate with the bend line superimposed over an edge of the tool plate.

29. The method as defined in claim 24 wherein,
the bending step is accomplished by moving at least one of a bladder and a tool plate toward each other with the sheet of material mounted therebetween on the tool plate with the bend line superimposed on an edge of the tool plate.

30. The method as defined in claim 24, and the step of:
after the bending step, securing a shin guard to the sheet material to extend across the bend line.

31. The method as defined in claim 24, and the step of:
depositing a continuous layer of coating material on at least one surface of the sheet of material across the displacements and the bend line after the bending step.

32. The method as defined in claim 24, and the step of:
depositing a continuous layer of flexible coating material on at least one surface sheet of material across the displacements and the bend line before the bending step.

33. The method as defined in claim 24 wherein,
the bending step is accomplished manually.

34. The method as defined in claim 24 wherein,
the bending step is accomplished using a press brake.

* * * * *